United States Patent
Liu et al.

(10) Patent No.: US 6,459,162 B1
(45) Date of Patent: Oct. 1, 2002

(54) ENCAPSULATED SEMICONDUCTOR DIE PACKAGE

(75) Inventors: Wen-Chun Liu, Pingtung (TW); Yung-Chao Jen, Kaohsiung (TW); Ming-Feng Wu, Kaohsiung Hsien (TW)

(73) Assignee: Walsin Advanced Electronics Ltd. (TW)

( * ) Notice: Subject to any disclaimer, the term of this patent is extended or adjusted under 35 U.S.C. 154(b) by 0 days.

(21) Appl. No.: 09/817,264

(22) Filed: Mar. 27, 2001

(51) Int. Cl.$^7$ ............................................. H01L 23/28
(52) U.S. Cl. ...................................... 257/787; 257/666
(58) Field of Search ................... 257/666, 787

(56) References Cited

U.S. PATENT DOCUMENTS 5,723,903 A * 3/1998 Masuda et al. ............. 257/676

* cited by examiner

Primary Examiner—Fetsum Abraham
Assistant Examiner—Leonardo Andújar
(74) Attorney, Agent, or Firm—Parkhurst & Wendel, L.L.P.

(57) ABSTRACT

A semiconductor die package has a lead frame, a die attached to the lead frame and an encapsulant enclosing the lead frame and the die. The distance between the top outside face of the encapsulant and the frame is substantially equal to the distance between the bottom outside face of the encapsulant and the die, and the distance between the top outside face of the encapsulant and the frame is substantially two and half times the distance between the bottom outside face of the encapsulant and the lead frame. Consequently, the different thickness of different encapsulant portions achieves an optimum balance during curing that effectively reduces the deformation of the encapsulant. In addition, the encapsulant can be completely formed by an injection process, and no crack will form in the encapsulant.

2 Claims, 3 Drawing Sheets

ENCAPSULATED SEMICONDUCTOR DIE PACKAGE

BACKGROUND OF THE INVENTION

1. Field of the Invention

The present invention relates to a semiconductor die package, and more particularly to an encapsulated semiconductor die package that can keep from bending.

2. Description of Related Art

With reference to FIG. 2, a conventional semiconductor die package in accordance with the prior art comprises a lead frame (21), a die (20) and an encapsulant (23). A passage (211) is defined in the middle portion of the lead frame (21), and multiple internal leads (not shown) are mounted on the lead frame (12) around the passage (211). Multiple external leads (112) are mounted around the lead frame (21) and extend outward from the encapsulant (23). In practice, because the I/O nodes (not shown) of the die (20) are arranged in the middle portion of the die (20), the die (20) is usually mounted on the bottom of the lead frame (Lead on Chip, LOC) by means of an adhesive layer (24). A bonding wire (22) is electrically connected between each internal lead (not shown) of the lead frame (21) and each corresponding I/O node (not shown) of the die (20). The encapsulant (23) is used to enclose the lead frame (21), die (20) and all of the bonding wires (22) to protect the encapsulated components. In the prior art, the distance (e) between the lead frame (21) and outside face of the encapsulant (23) is equal to the distance (f) between the lead frame (21) and the other outside face of the encapsulant (23).

However, the distance (g) between the die (20) and the outside bottom face of the encapsulant (23) in the conventional semiconductor die package is smaller than the distance (e) between the lead frame (21) and the top face of the encapsulant (23). The surface of the package easily bends upward in the packaging process due to the uneven curing speed between different parts of the encapsulant (23). Consequently the external leads (112) will not be in the same plane due to the deformation of the package.

With reference to FIG. 3, another conventional semiconductor die package was provided to solve the deformation problem. The distance (h) between the lead frame and the top outside face of the encapsulant (33) of the conventional semiconductor die package is formed to be substantially equal to the distance (i) between the die (30) and the bottom outside face of he encapsulant (33).

However, the distance (j) between the lead frame (33) and the bottom outside face of the encapsulant (33) of the conventional semiconductor die packaged device is about three times the distance (h) between the lead frame (31) and the top outside face of the encapsulant (33). Therefore, the bottom surface of the package easily bends downward in the packaging process because the curing speed of the lower encapsulant (33) portion is much slower than that of the upper encapsulant (33) portion.

To overcome the shortcomings, the present invention tends to provide an improved semiconductor die package to mitigate or obviate the aforementioned problems.

SUMMARY OF THE INVENTION

The main objective of the invention is to provide an improved semiconductor die package having a lead frame, a die attached to the lead frame and an encapsulant enclosing the lead frame and the die. The distance between the top outside face of the encapsulant and the frame is substantially equal to the distance between a bottom outside face of the encapsulant and the die, and the distance between the bottom outside face of the encapsulant and the lead frame is substantially two and half times the distance between the top outside face of encapsulant and the lead frame. This can effectively reduce the deformation of the encapsulant.

Other objects, advantages and novel features of the invention will become more apparent from the following detailed description when taken in conjunction with the accompanying drawings.

DETAILED DESCRIPTION OF PREFERRED EMBODIMENT

Figure 1:
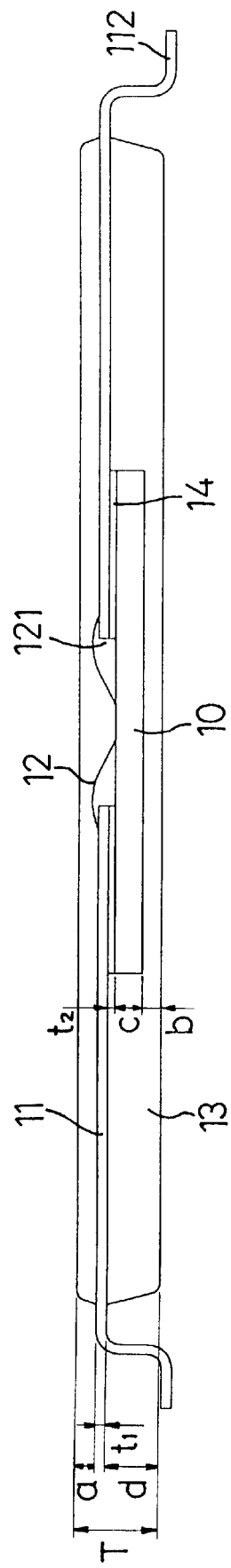
FIG. 1 is a side plan view in partial section of a semiconductor die package in accordance with the present invention.
Figure 2:
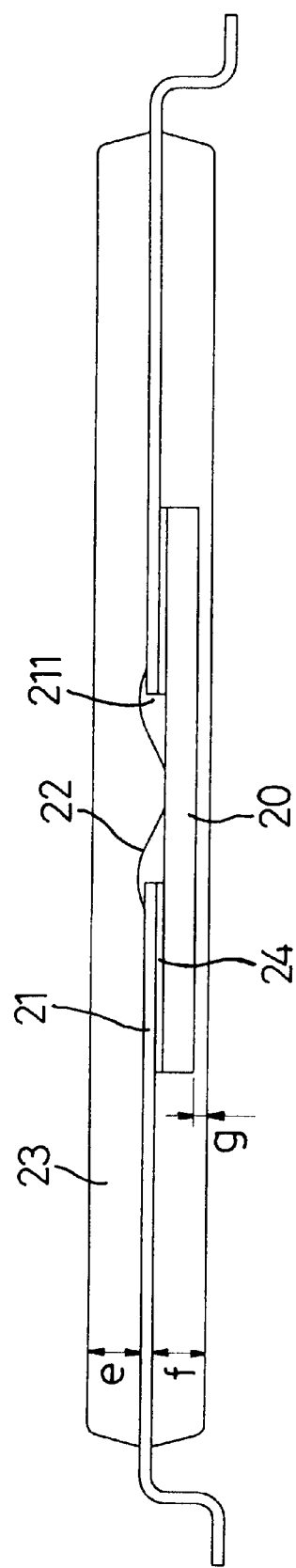
FIG. 2 is a side plan view in partial section of a conventional semiconductor die package in accordance with the prior art.

With reference to FIG. 1, a semiconductor die package in accordance with the present invention comprises a lead frame (11), a die (10) and an encapsulant (13). A passage (121) is defined in the middle portion of the lead frame (11), and multiple internal leads (not shown) are mounted on the lead frame (11) around the passage (121). Multiple external leads (not shown) are mounted around the lead frame (11) and extend outward from the encapsulant (13). The die (10) is mounted on the bottom of the lead frame (11) by an adhesive layer (14), and multiple I/O nodes (not shown) are mounted on the die (10). A bonding wire (12) is electrically connected between each internal lead (not shown) on the lead frame (11) and each corresponding I/O node (not shown) of the die (10).

Figure 3:
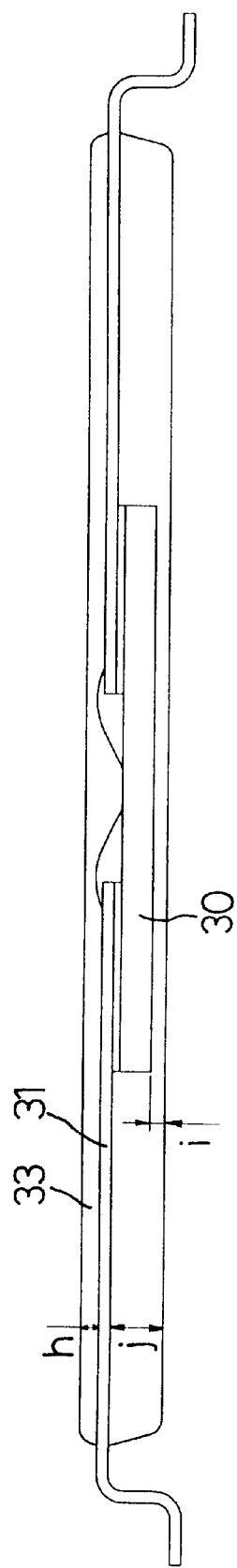
FIG. 3 is a side plan view in partial section of another embodiment of a conventional semiconductor die package in accordance with the prior art.

The encapsulant (13) is used to enclose the lead frame (11), die (10) and all of the bonding wires (12) to protect the components enclosed by the encapsulant (13). With reference to FIG. 3, the distance (h) between the lead frame (31) and the top outside face of the encapsulant (33) of the conventional semiconductor die package is substantially equivalent to the distance (i) between the die (30) and the bottom outside face of the encapsulant (33). With reference to FIG. 1, as determined by experimentation, the distance (d) between the lead frame (11) and the bottom outside face of the encapsulant (13) is formed to be about two and half times the distance (a) between the lead frame (11) and the top outside face of the encapsulant (13) by adjusting the thickness (c) of the die (10) by grinding. The thickness of different encapsulant (13) portions can achieve an optimum balance. This can keep the encapsulant (13) from bending and deforming during packaging process, and all of the external leads (not shown) can be kept in the same plane. In addition, the adhesive layer (14) can be completely formed by an injection process, and no cracks will form in the encapsulant (13).

With reference to FIG. 1, in an example of the foregoing design constraints used for a Lowprofile Quad Flat Package (LQFP), if the thickness (T) of the package is 1.4 millimeters (mm), the thickness ($t_1$) of the lead frame (11) is 0.127 mm, the thickness ($t_2$) of the adhesive layer (not numbered) is 0.03 to 0.1 mm, the distance (a) between the lead frame (11)

and top outside face of the encapsulant (13) must be 0.364 mm±0.0254, and the distance (b) between the die (10) and the bottom outside face of the encapsulant (13) must be equal to the distance (a). The distance (d) between the lead frame (11) and bottom face of the encapsulant (13) must be to 0.91 mm±0.0254 mm.

As an example of the foregoing design constraints used for a Thin Quad Flat Package (TQFP), if the thickness (T) of the encapsulant (13) is set to 1 mm, the thickness ($t_1$) of the lead frame (11) is 0.125 mm and the thickness ($t_2$) of the adhesive layer (not numbered) is 0.03 to 0.1 mm, the distance (a) between the lead frame (11) and top outer face of the encapsulant (13) must be 0.25 mm±0.0254 mm, and the distance (b) between the die (10) and the bottom outer face of the encapsulant (13) must be equal to the distance (a). The distance (d) between the lead frame (11) and the bottom face of the encapsulant (13) must be 0.625 mm±0.0254 mm.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An encapsulated semiconductor die package comprising:
   a lead frame having multiple leads attached around the lead frame;
   a die attached to the lead frame;
   multiple bonding wires each electrically connected between the lead frame and the die; and
   an encapsulant enclosing the lead frame, the die and the bonding wires, wherein
   a distance between an outermost face of the encapsulant and the lead frame is substantially equal to a distance between an innermost face of the encapsulant and the die; and
   the distance between the innermost face of the encapsulant and the lead frame is substantially two and one half times the distance between an outermost face of the encapsulant and the lead frame.

2. The encapsulated semiconductor die package as claimed in claim 1, wherein the ratio of the distance between the innermost face of the encapsulant and the lead frame to the distance between the outermost face of the encapsulant and the lead frame is achieved by adjusting the thickness of the die to a ratio of 2.5 to optimize a balance of thickness of different encapsulant portions and to keep the encapsulant from bending and deforming.

* * * * *

UNITED STATES PATENT AND TRADEMARK OFFICE
CERTIFICATE OF CORRECTION

PATENT NO.   : 6,459,162 B1
DATED        : October 1, 2002
INVENTOR(S)  : Wen-Chen Liu et al.

It is certified that error appears in the above-identified patent and that said Letters Patent is hereby corrected as shown below:

Title page,
Item [54], Title, please add after "PACKAGE" the following:

-- , AND METHOD FOR MAKING THE SAME --.

Signed and Sealed this

Seventeenth Day of December, 2002

JAMES E. ROGAN
*Director of the United States Patent and Trademark Office*